(12) United States Patent
Ichihara et al.

(10) Patent No.: US 7,625,644 B2
(45) Date of Patent: Dec. 1, 2009

(54) PERPENDICULAR MAGNETIC RECORDING MEDIUM AND MANUFACTURING OF THE SAME

(75) Inventors: Takayuki Ichihara, Tokyo (JP);
Hiroyuki Nakagawa, Kanagawa (JP);
Ikuko Takekuma, Kanagawa (JP);
Ichiro Tamai, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 590 days.

(21) Appl. No.: 11/257,978

(22) Filed: Oct. 24, 2005

(65) Prior Publication Data
US 2006/0088736 A1    Apr. 27, 2006

(30) Foreign Application Priority Data
Oct. 25, 2004  (JP)  ............................. 2004-309084

(51) Int. Cl.
*G11B 5/66* (2006.01)
(52) U.S. Cl. ...................................... 428/831
(58) Field of Classification Search ........................ None
See application file for complete search history.

(56) References Cited
U.S. PATENT DOCUMENTS
6,866,948 B2 *  3/2005  Koda et al. ............... 428/832.2

FOREIGN PATENT DOCUMENTS
JP    2003-178413    6/2003

\* cited by examiner

*Primary Examiner*—Holly Rickman
(74) *Attorney, Agent, or Firm*—Townsend and Townsend and Crew LLP; Darren Gold

(57) ABSTRACT

In a granular magnetic recording layer of a perpendicular magnetic recording medium, media noises are reduced by separating adequately magnetic crystal grains and non-magnetic grain boundary and decreasing magnetic exchange interactions among the magnetic crystal grains without causing damage to magnetic anisotropy of the magnetic crystal grains. In one embodiment, the perpendicular magnetic recording medium, in which crystal alloy grains containing Co, Pt, and Cr, and non-magnetic grain boundary containing Si and O is included; the ratio of the number of O atom to that of Si atom in the magnetic recording layer is between about 2.5 and 5; the Si atomic composition in the magnetic recording layer is between about 3 and 6 atomic %; and the O atomic composition in the magnetic recording layer is between about 12 and 20 atomic %, is used. The in-plane distribution of perpendicular coercivity at any points of the medium of the magnetic recording layer is made at most about ±10% of an average value.

12 Claims, 7 Drawing Sheets

Top of Chamber

Front View ( facing to surface of medium)

Front View      Side View

PERPENDICULAR MAGNETIC RECORDING MEDIUM AND MANUFACTURING OF THE SAME

CROSS-REFERENCES TO RELATED APPLICATIONS

This application claims priority from Japanese Patent Application No. JP2004-309084, filed Oct. 25, 2004, the entire disclosure of which is incorporated herein by reference.

BACKGROUND OF THE INVENTION

The present invention relates to a perpendicular magnetic recording medium and its manufacturing to which perpendicular magnetic recording technology is applied.

Perpendicular magnetic recording is attracting attention as a technology for enhancing areal recording density to make capacity of a magnetic recording medium large. The perpendicular magnetic recording is a system in which recorded bits are formed such that magnetization of the recording medium becomes normal to medium plane and magnetization in adjacent recorded bits becomes antiparallel to each other. Since the demagnetizing field is low in a magnetization transition region in the perpendicular magnetic recording system, a steep magnetization transition region is formed compared to longitudinal magnetic recording system, and the magnetization is stabilized at a high density. Accordingly, film thickness is allowed to be thicker, and thus the volume of magnetic crystal grains is allowed to be larger to acquire similar resolution compared with the longitudinal magnetic recording system, thereby enabling attenuation of recorded magnetization with time, i.e., thermal demagnetization, to be suppressed. Moreover, an intense magnetic recording field is obtained in a combination of a single pole type head and a perpendicular magnetic recording medium provided with a perpendicular magnetic recording layer and a soft-magnetic underlayer, allowing a material with high magnetic anisotropy to be selected for the perpendicular magnetic recording layer as well as thermal demagnetization to be further suppressed.

Currently, crystalline film of CoCr-based crystal alloy film is the mainstream of recording material for perpendicular magnetic recording medium. By controlling crystallographic orientation in a way that the c axis of CoCr crystal having an hcp structure becomes normal to medium plane, the axis of easy magnetization of the magnetic recording layer can be kept normal to medium plane. Here, the medium noises can be reduced and the recording density can be improved by making the grain size of CoCr-based crystal alloy small as well as its size variations reduced, and thus allowing magnetic exchange interactions among individual grains to be decreased. As a mode of controlling such a structure of the magnetic recording layer, a magnetic recording layer generally called granular thin film in which the periphery of ferromagnetic grains is surrounded by a non-magnetic material such as oxide is proposed. The non-magnetic grain boundary separates the magnetic crystal grains in the granular magnetic recording layer and decreases magnetic exchange interactions among the magnetic crystal grains, thereby enabling noises in the magnetization transition region to be reduced. A perpendicular magnetic recording medium having a magnetic recording layer composed of a ferromagnetic alloy containing Co and Pt, and an oxide with a volume density of 15% to 40% is disclosed in JP-A No. 178413/2003.

BRIEF SUMMARY OF THE INVENTION

A feature of the present invention is to decrease magnetic exchange interactions among magnetic crystal grains and to reduce media noises without degradation of magnetic anisotropy of the magnetic crystal grains by separating adequately the magnetic crystal grains and non-magnetic grain boundary in a granular magnetic recording layer of a perpendicular magnetic recording medium.

The perpendicular magnetic recording medium according to an aspect of the present invention is characterized in that a non-magnetic grain size control layer, a magnetic recording layer containing a ferromagnetic material, and an overcoat are laminated in turn on a non-magnetic disk substrate, where the magnetic recording layer contains crystal alloy grains containing at least Co, Pt, and Cr, and non-magnetic grain boundary containing at least Si and O, the ratio of the number of O atom to that of Si atom in the magnetic recording layer is between about 2.5 and 5, further the Si atomic composition in the magnetic recording layer is between about 3 atomic % and 6 atomic %, the O atomic composition in the magnetic recording layer is between about 12 atomic % and 20 atomic %, and coercivity in the direction normal to medium plane is distributed within about ±10% of an average value.

The manufacturing of the perpendicular magnetic recording medium according to an embodiment of the present invention is characterized in that depositing the non-magnetic grain size control layer on the non-magnetic disk substrate, depositing the magnetic recording layer containing at least Co, Pt, Cr, Si, and O on the grain size control layer, and depositing the overcoat on the magnetic recording layer are provided, where, in the step of depositing the magnetic recording layer, a process gas containing oxygen is introduced into a chamber placed with the non-magnetic substrate such that a partial pressure of oxygen on the surface of the non-magnetic substrate becomes approximately uniform. For example, the process gas containing oxygen is introduced from gas inlets arranged concentrically with the center of the substrate. As the result, the in-plane distribution of perpendicular coercivity at any points of the medium of the magnetic recording layer can be made at most about ±10% of an average value in the perpendicular magnetic recording medium of the present invention.

According to the present invention, it becomes possible to control magnetic exchange interactions among the magnetic crystal grains within a desirable range by segregation of $SiO_2$ and Cr oxide around ferromagnetic grains mainly composed of Co and Pt. As the result, an excellent perpendicular magnetic recording medium with a high SNR is obtained.

DETAILED DESCRIPTION OF THE INVENTION

Hereinafter, embodiments of the present invention are explained with reference to the drawings.

Figure 1:
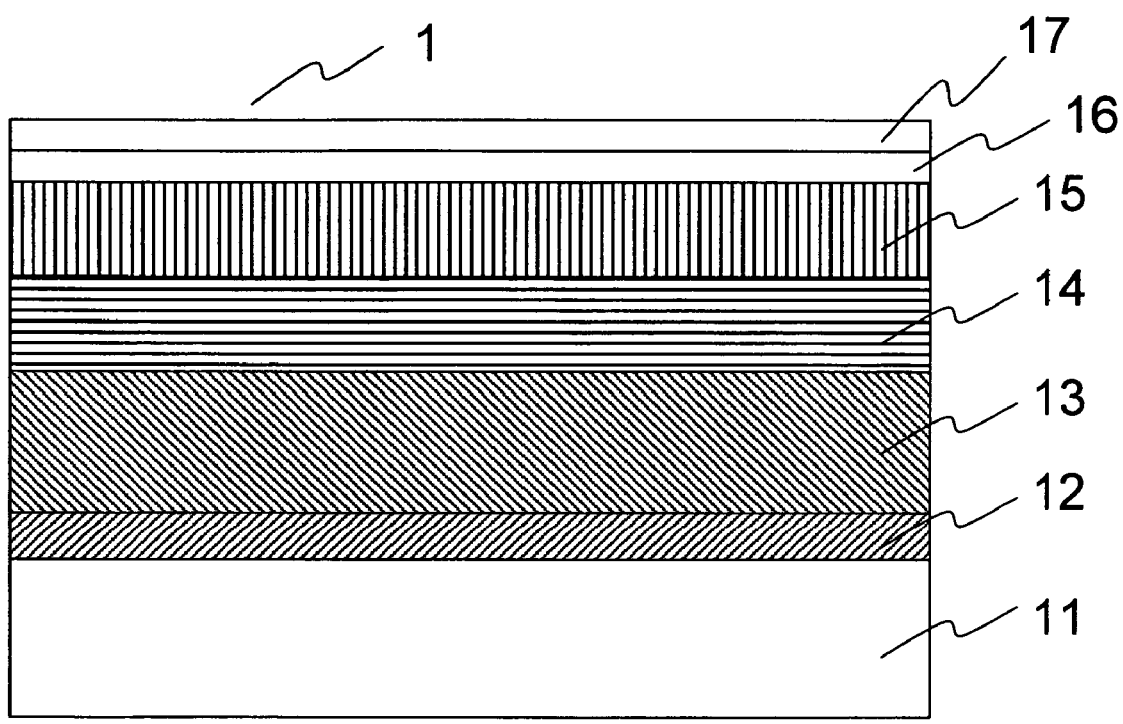
FIG. 1 is a schematic cross sectional diagram to explain a structural example of a perpendicular magnetic recording medium according to an embodiment of the present invention.

FIG. 1 is a schematic cross sectional diagram to explain a structural example of a perpendicular magnetic recording medium according to an embodiment of the present invention. It should be noted that the perpendicular magnetic recording medium shown in FIG. 1 exemplifies the present invention and the present invention is not limited to the one having these compositions. In a perpendicular magnetic recording medium 1 of the present invention, a pre-coat layer 12, a soft-magnetic underlayer 13, a grain size control layer 14, and a granular magnetic recording layer 15 were deposited in turn on a non-magnetic disk substrate 11 by a sputtering method, and an overcoat 16 was deposited thereon by a chemical vapor deposition method (CVD method). After taking the medium out of a film forming apparatus, a liquid lubricant layer 17 was coated. A 2.5-inch glass substrate was used for the substrate 11, while a NiP-plated aluminum alloy is used generally for magnetic recording media and a plastic substrate may also be used.

The pre-coat layer 12 is provided with the aim of strengthening adhesion between the substrate and a thin film. Here, a NiTa alloy thin film in a film thickness of 30 nm was used. The soft-magnetic underlayer 13 is provided with the aim of making strong the perpendicular component of a magnetic field applied at the time of recording particularly in a combination with a single pole type head used for perpendicular magnetic recording. For a material of the soft-magnetic underlayer 13, a material with high saturation magnetization and high relative permeability is desired, and conventional soft-magnetic materials able to exert such features can be used. Further, from the viewpoint of magnetic property and stray field robustness, the soft-magnetic underlayer 13 may be constructed in a multilayer structure having ferromagnetic coupling or anti-ferromagnetic coupling by providing non-magnetic layers between multiple soft-magnetic material layers. In the present embodiment, the soft-magnetic underlayer 13 was made to be a multilayer film having anti-ferromagnetic coupling in which a CoTaZr layer in a film thickness of about 50 nm, a Ru layer in a film thickness of about 0.6 nm, and CoTaZr layer in a film thickness of about 50 nm were deposited in turn.

The grain size control layer 14 is provided to reduce magnetic coupling generated between the soft-magnetic underlayer 13 and the granular magnetic recording layer 15 as well as to control perpendicular magnetic anisotropy of the granular magnetic recording layer 15 by controlling crystallographic orientation of ferromagnetic grains of the granular magnetic recording layer 15 and further to make magnetic exchange interactions among the ferromagnetic grains desirable by promoting separation of the ferromagnetic grains and non-magnetic grain boundary of the granular magnetic recording layer 15. For a material of the grain size control layer 14, metal or alloy that is non-magnetic and amorphous or in a hexagonal closed packed lattice structure (hcp structure) or face-centered cubic lattice structure (fcc structure) can be used. Although the grain size control layer 14 can be of a single layer, it can also be formed in a structure with multilayers having different crystalline structures to attain the above effect desirably. In the present embodiment, the grain size control layer 14 was made in a multilayer structure in which Ta in a film thickness of about 1 nm and Ru in a film thickness of about 20 nm were deposited in turn.

The granular magnetic recording layer 15 is composed of ferromagnetic crystal grains and their surrounding non-magnetic grain boundary. The ferromagnetic crystal grains are desired to be alloy containing at least Co and Pt. Further, it is also desirable to add Cr, Ta, B, and the like to the CoPt alloy in order to achieve low noise characteristics by controlling magnetic property and crystallographic orientation. For a material forming the non-magnetic grain boundary, oxides and nitrides are preferred, and further, physicochemical stability is desired. In consideration of the foregoing, the granular magnetic recording layer 15 in the present embodiment has a structure consisting of ferromagnetic grains mainly composed of Co, Pt, and Cr, and non-magnetic grain boundary mainly composed of Si oxide, and the granular magnetic recording layer 15 in a film thickness of about 14 nm was deposited by the sputtering method.

The overcoat 16 can be deposited in a thin film mainly composed of, for example, carbon or Si by the sputtering method or CVD method. In the present embodiment, the carbon overcoat 16 in a film thickness of 4 nm was deposited by the chemical vapor deposition method (CVD method). Moreover, for the liquid lubricant layer 17, a material and a method of deposition similar to those for conventional magnetic recording media can be used. In the present embodiment, a perfluoro-polyether lubricant in a film thickness of 1 nm was deposited by a pulling method.

Figure 2:
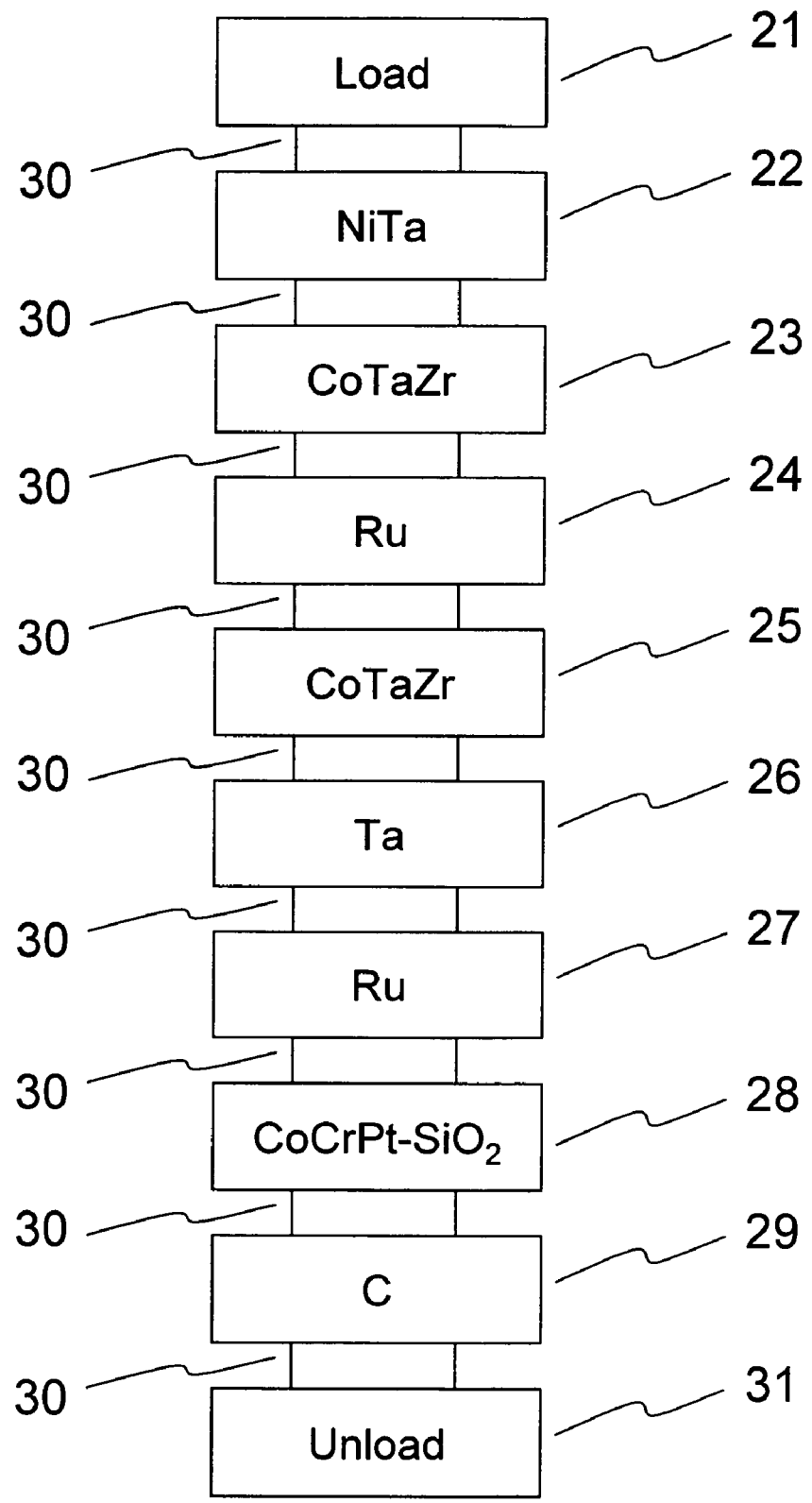
FIG. 2 is a schematic diagram of a deposition apparatus.

FIG. 2 is a schematic diagram of a deposition apparatus with which the perpendicular recording medium of the present embodiment was manufactured. A load chamber 21, deposition chambers 22 to 29, an unload chamber 31 are connected to exhaust pumps, respectively, and the background pressure in each chamber is maintained at $10^{-4}$ Pa or lower. Load locks 30 with opening and closing door are provided between the chambers, respectively, thereby allowing the pressure in each chamber to be controlled independently during the manufacturing process. The deposition chambers 22 to 28 are provided with sputtering apparatus respectively, the chamber 29 with a CVD apparatus, and each layer of the perpendicular magnetic recording medium can be deposited in turn. In addition, the deposition apparatus is provided with a substrate transfer device (not illustrated) which supports the substrate 11 and can move freely between the chambers.

Figure 3:
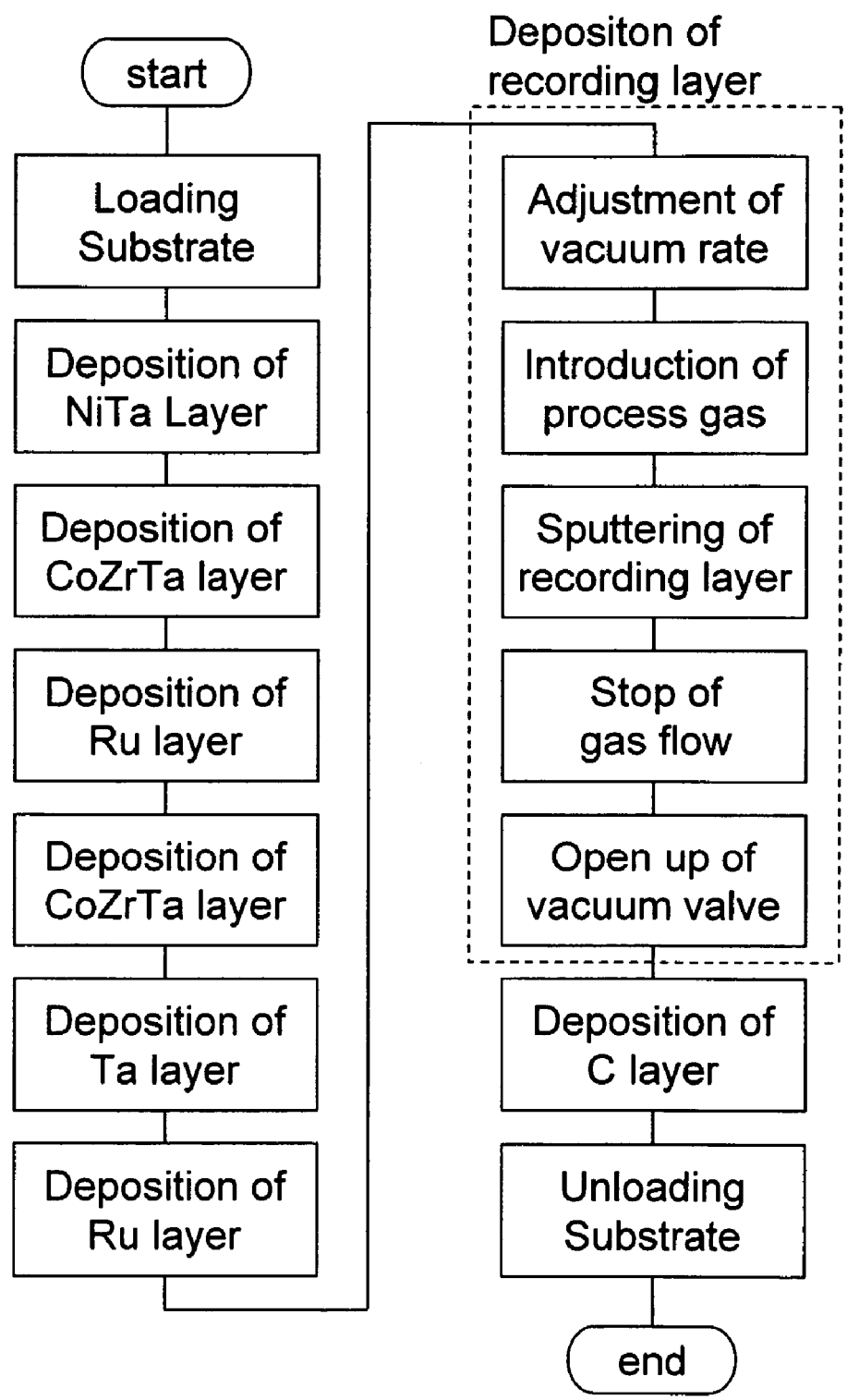
FIG. 3 is a deposition flow chart for the perpendicular magnetic recording medium according to an embodiment of the present invention.

The manufacturing procedures up to the overcoat 16 are shown in FIG. 3. First, the substrate 11 is transferred into the load chamber 21 with keeping the pressure in the load chamber 21 at atmospheric pressure, followed by reducing the pressure in the load chamber 21 to $10^{-3}$ Pa or lower. Then, the door of the load lock 30 is opened to move the substrate 11 into the process chamber 22 by means of the substrate transfer device, and the door of the load lock 30 is closed. Subsequently, the ratio of the vacuum valve opening in the chamber 22 is adjusted for adjustment of vacuum, Ar gas is introduced into the chamber 22, and the pre-coat layer 12 of NiTa is deposited by the sputtering method. After forming the NiTa layer 12, the introduction of Ar gas is stopped, the vacuum valve opened, the door of the load lock 30 opened, and the substrate 11 moved to the chamber 23. By the procedures similar to the above step, the substrate 11 is moved to the chambers 23 to 29 by turns to form films. After the C overcoat 16 is deposited and the substrate 11 is moved to the unload chamber 31, the pressure in the unload chamber 31 is made to be atmospheric pressure, and the substrate 11 deposited with each layer is unloaded. It should be noted that transfer steps of the substrate 11 and detailed steps in forming the layers other than the granular magnetic recording layer 15 are omitted in the flow chart of FIG. 3.

The granular magnetic recording layer 15 of the perpendicular magnetic recording medium of the present embodiment was manufactured as below. Film deposition was carried out by a DC sputtering method with the use of a composite target containing CoCrPt alloy and $SiO_2$ in a mixed atmosphere of Ar and oxygen at a pressure of 4 Pa to 5 Pa at a film forming rate in a range of from 0.7 nm/sec to 2.0 nm/sec. For the sputtering method, a RF sputtering method can be also selected. Here, the substrate is not heated before forming the magnetic recording layer 15, and the film deposition of the magnetic recording layer 15 was carried out in a relatively low condition ranging from room temperature to 70 degrees C. for the substrate temperature.

Figure 4:
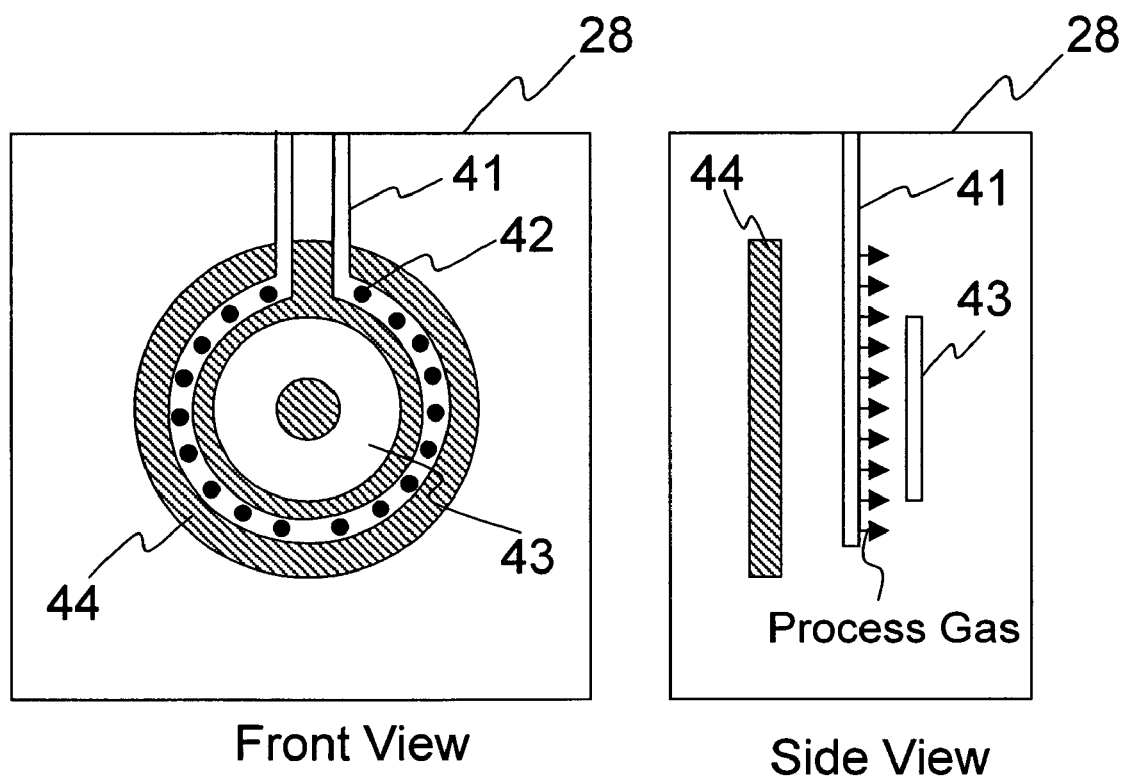
FIG. 4 is a schematic drawing of inlet piping for sputtering gas and a chamber.

When the magnetic recording layer 15 was deposited, piping 41 as shown in FIG. 4 was placed between a target 44 and a substrate 43 so that the partial pressure of oxygen in the vicinity of the surface of the substrate becomes uniform over the entire medium surface. Gas inlets 42 are provided on the side of the piping 41 opposite to the substrate 43 concentrically with the center of the substrate, and the magnetic recording layer 15 was deposited while a mixed gas of Ar and oxygen was belched out from the gas inlets 42. Since the atomic compositions in the granular magnetic recording layer 15 vary depending on not only the target composition but also the input power, the gas pressure, the distance between the substrate and the target, and the like at the time of sputtering, chemical composition analysis with the use of X-ray photoelectron spectroscopy (XPS) was carried out to investigate the relation between characteristics and compositions. The medium noise SNRd was evaluated using a composite single pole type head with the recording head width of 170 nm and the reading head width of 125 nm by the use of a common read/write tester.

Table 1 shows atomic proportions of each atom of Co, Pt, Cr, Si, and O around the center of film thickness in the magnetic recording layer of the perpendicular magnetic recording media manufactured by varying target compositions and conditions for film deposition, and SNRd (Signal to Noise Ratio of disk) calculated from the ratio of output when recorded at a linear recording density of 100 KFCI to media noise when recorded at 800 kFCI.

Figure 5:
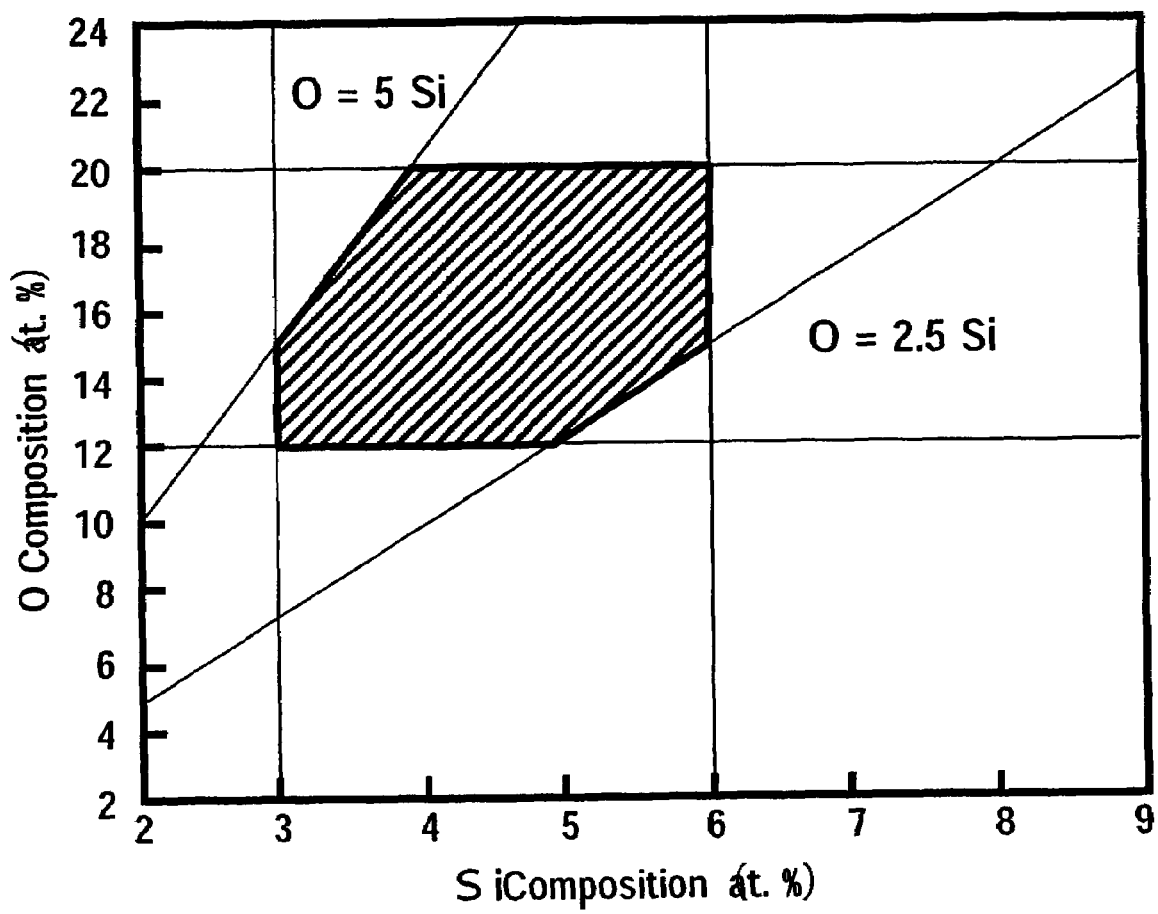
FIG. 5 is a graph showing the relation of Si atomic composition and O atomic composition in a magnetic recording layer to SNRd.

FIG. 5 shows distribution of SNRd when Si atomic composition and 0 atomic composition were varied. Within the region of the shaded area of FIG. 5, SNRd becomes 22 dB or higher, and an areal recording density of 7.75 gigabits per square millimeter can be realized in this region. More desirable SNRd of 23 dB or higher was obtained in a region where the Si atomic composition was from about 4 atomic % to 5 atomic % and the 0 atomic composition was about 14 atomic % to 18 atomic %. Formation of Cr oxide was confirmed in XPS profile, suggesting that $SiO_2$ and Cr oxide were desirably formed at the non-magnetic grain boundary in the above region and that magnetic exchange interactions among ferromagnetic grains could be desirably controlled. When the ratio of the O atomic composition to the Si atomic composition, O/Si, is smaller than 2.5, or when the O atomic composition is smaller than 12 atomic %, or when the Si atomic composition is smaller than 3 atomic %, SNRd deteriorates because formation of the non-magnetic grain boundary is insufficient and the magnetic exchange interactions among ferromagnetic grains cannot be effectively decreased. On the other hand, when the O/Si is larger than 5, SNRd is considered to deteriorate because Co in the ferromagnetic grains is oxidized and the ferromagnetic grains become finer to result in losing magnetic anisotropy. Further, when the Si atomic composition is larger than 6 atomic % or when the O atomic composition is larger than 20 atomic %, SNRd is considered to deteriorate because the ferromagnetic grains become relatively small to result in lowering of the magnetic anisotropy. It should be noted that the volume density of the non-magnetic grain boundary determined from lattice images of the medium surface taken by a transmission electron microscope ranged from about 17% by volume to 29% by volume in the embodiments 1-1 to 1-12.

Figure 6:
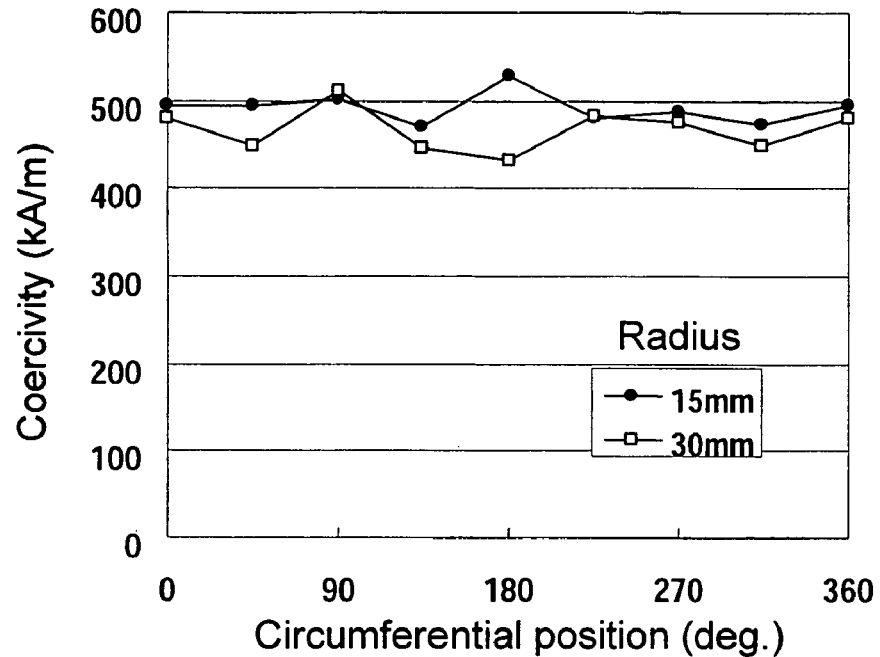
FIG. 6 is a graph showing in-plane distribution of coercivity of the perpendicular magnetic recording medium according to an embodiment of the present invention.
Figure 7:
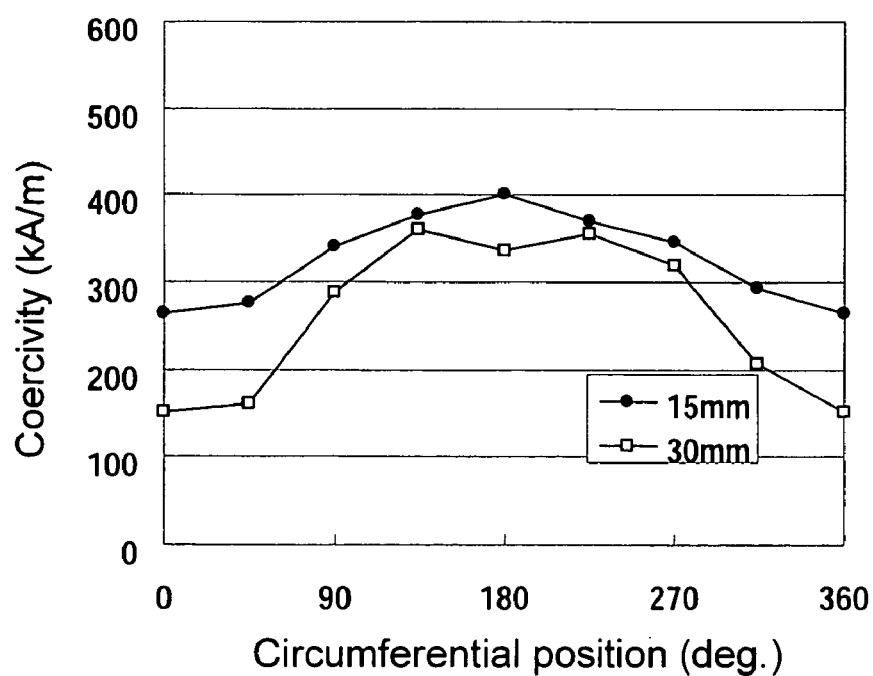
FIG. 7 is a graph showing in-plane distribution of coercivity in a perpendicular magnetic recording medium of a comparison.
Figure 8:
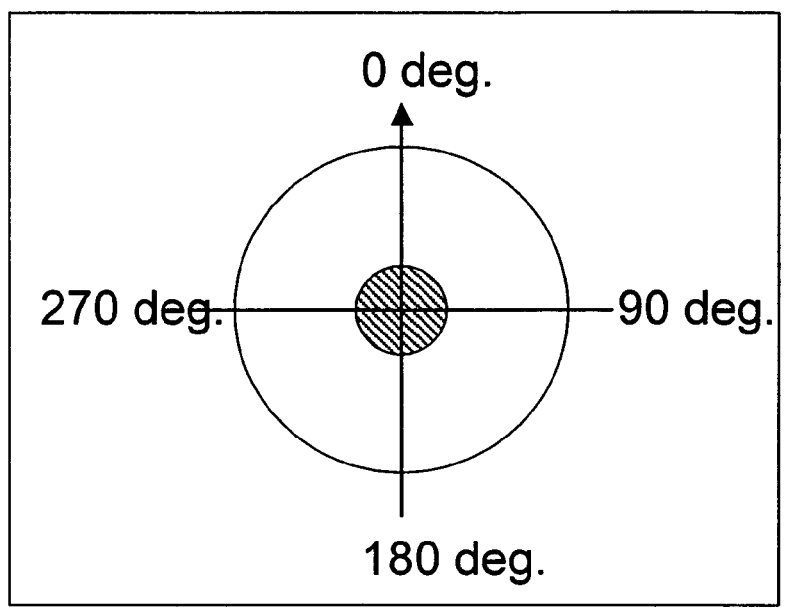
FIG. 8 is a schematic drawing to show the horizontal axes in FIGS. 6 and 7 and positions of the medium planes.
Figure 9:
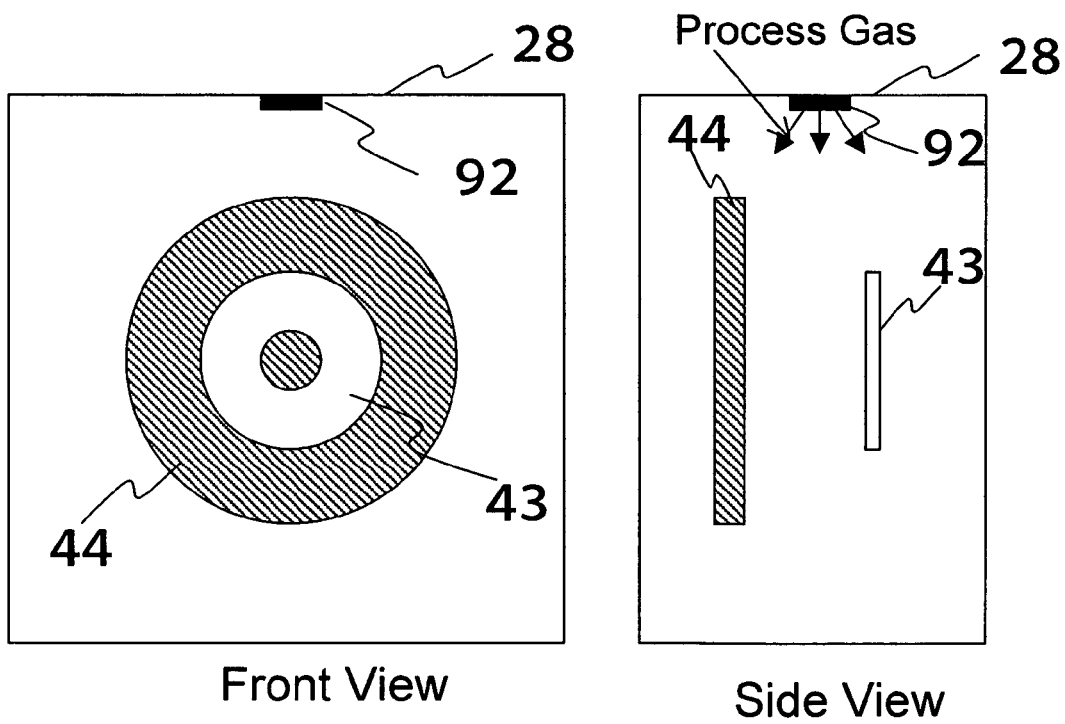
FIG. 9 is a schematic drawing of a chamber to form a magnetic recording layer in a manufacturing method of the comparison.

Coercivity in the direction normal to medium plane at various points of the medium plane of the perpendicular magnetic recording medium manufactured by using the manufacturing method of the present invention is shown in FIG. 6. The coercivity was measured with a Kerr effect magnetometer. Here, the horizontal axis in FIG. 6 corresponds to the angular coordinate shown in FIG. 8, and the results measured at radii of 15 mm and 30 mm are shown. The in-plane distribution of coercivity in the normal direction of a perpendicular magnetic recording medium, in which the magnetic recording layer was formed by introducing a process gas from above the chamber 28 by providing a process gas inlet 92 in the upper part of the chamber 28 as shown in FIG. 9, as a comparison to the manufacturing method of the present invention is shown in FIG. 7. The coercivity at the angle of 0 degree in the comparison became markedly low as shown in FIG. 7. This is considered because excess oxygen was taken in at the angle of 0 degree close to the sputtering gas inlet and the perpendicular magnetic anisotropy of the ferromagnetic grains became small. On the other hand, in the perpendicular magnetic recording medium manufactured by the manufacturing method of the present invention, oxygen was almost uniformly introduced into the medium owing to the use of the gas inlet piping 41 in FIG. 4, and the distribution of coercivity was minimized as shown in FIG. 6.

The maximum, minimum, and average values of coercivity in the normal direction and SNRd of the perpendicular magnetic recording medium of the present invention and the perpendicular magnetic recording medium of the comparison are shown in Table 2. SNRd values were low in the comparisons because quantities of oxygen introduced to the surfaces of the media varied significantly, whereas high SNRd values were obtained in the present embodiments. Although the distribution of coercivity of the embodiment shown in Table 2 was +10% and −10% for the maximum value and the minimum value, respectively, relative to the average value, this embodiment represented the maximal distribution of coercivity among the present embodiments, and it was demonstrated that SNRd able to realize an areal recording density of 7.75 gigabit per square millimeter can be obtained by making the distribution of coercivity within ±10% of the average value.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

TABLE 1

| | Composition (at. %) | | | | | | SNRd | Perpendicular Coercivity (kA/m) | | |
|---|---|---|---|---|---|---|---|---|---|---|
| | Co | Pt | Cr | Si | O | O/Si | (dB) | Average | Max. | Min. |
| Embodiment1-1 | 50.7 | 21.5 | 6.3 | 4.7 | 16.0 | 3.4 | 23.2 | 480.5 | 520.2 | 451.2 |
| Embodiment1-2 | 50.2 | 21.7 | 5.8 | 3.9 | 18.1 | 4.6 | 23.1 | 475.3 | 513.3 | 445.1 |
| Embodiment1-3 | 53.5 | 20.5 | 7.5 | 4.0 | 13.9 | 3.5 | 23.0 | 485.2 | 515.8 | 440.9 |
| Embodiment1-4 | 54.8 | 19.0 | 7.8 | 5.1 | 13.0 | 2.6 | 23.1 | 492.1 | 535.4 | 459.6 |
| Embodiment1-5 | 46.6 | 20.8 | 8.6 | 5.2 | 18.5 | 3.5 | 23.0 | 485.3 | 521.7 | 437.3 |
| Embodiment1-6 | 53.0 | 22.8 | 8.7 | 3.2 | 12.1 | 3.8 | 22.3 | 442.5 | 475.1 | 421.2 |
| Embodiment1-7 | 52.1 | 22.3 | 7.1 | 3.1 | 14.8 | 4.8 | 22.0 | 475.2 | 491.3 | 431.5 |
| Embodiment1-8 | 46.2 | 20.5 | 8.8 | 4.2 | 19.7 | 4.7 | 22.4 | 479.0 | 526.0 | 431.4 |
| Embodiment1-9 | 49.0 | 23.0 | 10.6 | 4.8 | 12.3 | 2.6 | 22.2 | 439.0 | 462.5 | 401.1 |
| Embodiment1-10 | 49.0 | 20.8 | 9.1 | 5.7 | 15.0 | 2.6 | 22.1 | 463.2 | 473.0 | 452.0 |
| Embodiment1-11 | 47.2 | 20.5 | 8.8 | 5.8 | 17.1 | 2.9 | 22.0 | 436.2 | 465.2 | 419.1 |
| Embodiment1-12 | 46.3 | 18.8 | 8.8 | 5.6 | 19.7 | 3.5 | 22.1 | 433.5 | 465.5 | 411.2 |
| Comparison1 | 53.0 | 19.1 | 12.2 | 2.8 | 12.5 | 4.5 | 14.9 | 280.1 | 297.6 | 263.4 |
| Comparison2 | 50.7 | 21.5 | 9.0 | 2.9 | 15.7 | 5.4 | 16.2 | 302.4 | 318.3 | 280.1 |
| Comparison3 | 52.7 | 22.2 | 10.2 | 3.3 | 11.0 | 3.3 | 15.1 | 286.5 | 295.2 | 274.5 |
| Comparison4 | 48.9 | 21.0 | 8.8 | 3.4 | 17.5 | 5.1 | 17.8 | 358.1 | 370.0 | 327.8 |
| Comparison5 | 46.1 | 20.7 | 8.6 | 4.0 | 20.3 | 5.1 | 21.1 | 405.8 | 421.7 | 381.9 |
| Comparison6 | 49.2 | 23.3 | 10.9 | 4.7 | 11.5 | 2.4 | 20.5 | 389.9 | 413.8 | 374.0 |
| Comparison7 | 49.0 | 22.2 | 10.5 | 5.6 | 12.5 | 2.2 | 15.2 | 254.6 | 286.5 | 222.8 |
| Comparison8 | 46.0 | 20.2 | 7.5 | 5.7 | 20.2 | 3.5 | 20.8 | 421.7 | 445.6 | 389.9 |
| Comparison9 | 46.3 | 19.7 | 9.9 | 6.2 | 17.0 | 2.7 | 19.2 | 358.1 | 389.9 | 334.2 |
| Comparison10 | 44.6 | 19.0 | 9.4 | 6.1 | 20.2 | 3.3 | 18.6 | 381.9 | 413.8 | 350.1 |
| Comparison11 | 57.0 | 21.0 | 12.3 | 2.8 | 6.8 | 2.4 | 14.0 | 270.5 | 286.5 | 246.7 |

TABLE 2

| | | Embodiment1-8 | Comparison12 |
|---|---|---|---|
| Composition | Co | 46.2 | 46.3 |
| (At. %) | Pt | 20.5 | 20.8 |
| (Average) | Cr | 8.8 | 9.0 |
| | Si | 4.2 | 4.3 |
| | O | 19.7 | 19.0 |
| | O/Si | 4.7 | 4.4 |
| Coercivity | Average | 479.0 | 292.1 |
| (kA/m) | Max. | 527.5 | 400.9 |
| | Min. | 431.3 | 151.7 |
| SNRd (dB) | | 22.4 | 16.2 |

What is claimed is:

1. A perpendicular magnetic recording medium comprising at least a non-magnetic grain size control layer, a magnetic recording layer containing a ferromagnetic material, and an overcoat laminated by turns on a non-magnetic substrate, wherein the magnetic recording layer contains Co, Pt, Cr, Si, and O; the ratio of the number of O atom to the number of Si atom in the magnetic recording layer is between about 2.5 and 5; the Si atomic composition therein is between about 3 atomic % and 6 atomic %; the O atomic composition therein is between about 12 atomic % and 20 atomic %; and coercivity in the direction normal to the media plane is distributed within about ±10% of an average value of an in-plane distribution of perpendicular coercivity in the medium, and wherein the non-magnetic grain size control layer comprises a Ta layer and a Ru layer deposited in turn.

2. A perpendicular magnetic recording medium comprising at least a non-magnetic grain size control layer, a magnetic recording layer containing a ferromagnetic material, and an overcoat laminated by turns on a non-magnetic substrate, wherein the magnetic recording layer contains Co, Pt, Cr, Si, and O; the ratio of the number of O atom to the number of Si atom in the magnetic recording layer is between about 2.5 and 5; the Si atomic composition therein is between about 3 atomic % and 6 atomic %; the O atomic composition therein is between about 12 atomic % and 20 atomic %; and coercivity in the direction normal to the media plane is distributed within about ±10% of an average value of an in-plane distribution of perpendicular coercivity in the medium, and wherein the non-magnetic grain size control layer comprises a Ta layer of about 1 nm in thickness and a Ru layer of about 20 nm in thickness.

3. The perpendicular magnetic recording medium according to claim 1, wherein a soft-magnetic underlayer is provided below the grain size control layer.

4. The perpendicular magnetic recording medium according to claim 3, wherein the soft-magnetic underlayer comprises a multilayer structure having a CoTaZr layer, a Ru layer, and a CoTaZr layer deposited in turn.

5. The perpendicular magnetic recording medium according to claim 4, wherein the multilayer structure of the soft-magnetic underlayer has the CoTaZr layer of about 50 nm in thickness, the Ru layer of about 0.6 nm in thickness, and the CoTaZr layer of about 50 nm in thickness.

6. The perpendicular magnetic recording medium according to claim 1, wherein the magnetic recording layer includes ferromagnetic grains having Co, Pt, and Cr and a non-magnetic grain boundary having Si oxide.

7. The perpendicular magnetic recording medium according to claim 1, wherein the magnetic recording layer has a thickness of about 14 nm.

8. The perpendicular magnetic recording medium according to claim 2, wherein a soft-magnetic underlayer is provided below the grain size control layer.

9. The perpendicular magnetic recording medium according to claim 8, wherein the soft-magnetic underlayer comprises a multilayer structure having a CoTaZr layer, a Ru layer, and a CoTaZr layer deposited in turn.

10. The perpendicular magnetic recording medium according to claim 9, wherein the multilayer structure of the soft-magnetic underlayer has the CoTaZr layer of about 50 nm in thickness, the Ru layer of about 0.6 nm in thickness, and the CoTaZr layer of about 50 nm in thickness.

11. The perpendicular magnetic recording medium according to claim 2, wherein the magnetic recording layer includes ferromagnetic grains having Co, Pt, and Cr and a non-magnetic grain boundary having Si oxide.

12. The perpendicular magnetic recording medium according to claim 2, wherein the magnetic recording layer has a thickness of about 14 nm.

* * * * *